United States Patent
Han et al.

(10) Patent No.: US 7,173,511 B2
(45) Date of Patent: Feb. 6, 2007

(54) SURFACE-MOUNTED THERMISTOR AND MANUFACTURING METHOD THEREOF

(75) Inventors: Jun-Ku Han, Seoul (KR); Su-An Choi, Gyeonggi-do (KR); Chang-Mo Ko, Gyeonggi-do (KR); An-Na Lee, Seoul (KR); Jong-Hwan Lee, Gyeonggi-do (KR); Ju-Dam Kim, Seoul (KR); Jong-Ho Lee, Gyeonggi-do (KR); Dong-Hyun Kim, Gyeonggi-do (KR)

(73) Assignee: LG Cable Ltd., Seoul (KR)

( * ) Notice: Subject to any disclaimer, the term of this patent is extended or adjusted under 35 U.S.C. 154(b) by 229 days.

(21) Appl. No.: 10/859,505

(22) Filed: Jun. 1, 2004

(65) Prior Publication Data
US 2005/0057338 A1 Mar. 17, 2005

(30) Foreign Application Priority Data
Sep. 17, 2003 (KR) ............ 10-2003-0064409

(51) Int. Cl.
*H01C 7/10* (2006.01)
(52) U.S. Cl. ............ 338/22 R; 338/25; 338/28
(58) Field of Classification Search ........ 338/22 R, 338/22 SD, 254, 319, 320, 260; 361/103
See application file for complete search history.

(56) References Cited

U.S. PATENT DOCUMENTS 6,380,839 B2    4/2002  Li et al. ............ 338/22 R
6,556,123 B1 *  4/2003  Iwao et al. ............ 338/22 R
2003/0227731 A1* 12/2003 Huang et al. ............ 361/103
2004/0108936 A1*  6/2004 Han et al. ............ 338/22 R
2005/0062581 A1*  3/2005 Koyama ............ 338/22 R

FOREIGN PATENT DOCUMENTS

JP    10-125505    5/1998
KR    1998-080414  11/1998
KR    2000-0062369 10/2000
KR    2001-0021548  3/2001

* cited by examiner

Primary Examiner—Tu Hoang
(74) Attorney, Agent, or Firm—Jones Day

(57) ABSTRACT

A thermistor, which is to be mounted on a PCB, for protecting other circuit elements is disclosed. Electrode patterns separately formed on both surfaces of a film resistance element are respectively shaped into two parts which are engaged to each other with a non-conductive gap interposed therebetween. Thus, a Tombstone phenomenon caused by asymmetric structure may be fundamentally prevented. Grooves are formed in both sides of the thermistor, and connection portions for electrically connecting the electrodes formed on both surfaces of the thermistor are formed through the inside of the grooves or through the sides except the grooves. Thus, though a crack arises in the connection portion, it is possible to prevent the crack from being propagated to the entire connection portion along the side of the thermistor.

14 Claims, 10 Drawing Sheets

SURFACE-MOUNTED THERMISTOR AND MANUFACTURING METHOD THEREOF

BACKGROUND OF THE INVENTION

1. Field of the Invention

The present invention relates to a thermistor changing a resistance value depending on temperature, and more particularly to a surface-mounted thermistor being mounted on a PCB (printed circuit board) and having a function of protecting other circuit elements.

2. Description of the Related Art

Among conductive materials, some materials change their specific resistances depending on temperature. A resistance element made using such materials is generally called 'a thermistor', which are representatively classified into an NTC (negative temperature coefficient) resistance element whose resistance decreases according to the rise of temperature and a PTC (positive temperature coefficient) resistance element whose resistance increases according to the rise of temperature.

In particular, the PTC resistance element passes a current at a low temperature such as a normal temperature since its resistance is low, while it interrupts a current if a temperature of the material is increased due to an excess current or a surrounding temperature is increased because its resistance increases as much as 1,000 to 10,000 times of its origin state. Thus, the PTC resistance element is commonly used as an element being mounted on a PCB for protecting other circuit elements by restraining an excess current.

Meanwhile, since various circuit elements are mounted on the PCB, the thermistor suffers from many restrictions in its mounting location and structure, particularly in the trend of these days, as described below in brief.

The thermistor is generally configured so that electrodes are respectively laminated on upper and lower surfaces of a layer made of PTC material. The thermistor configured as above is mounted by soldering an electrode, formed on the lower surface of the thermistor, to an electrode pad previously formed on a PCB surface. At this time, a separate wire is required for connecting the electrode formed on the upper surface of the thermistor to the electrode pad on the PCB, which also needs a relevant procedure and a space on the PCB. Thus, in order to avoid such disadvantages, the electrode on the lower surface of the thermistor is formed not on the entire area of the lower surface but on a region except a partial portion, and a metal pattern separated from the electrode on the lower surface is formed in the partial portion. The metal pattern and the upper electrode are electrically connected through a side of the PTC material layer. Then, when the thermistor is mounted on the PCB, the electrode and the metal pattern on the lower surface of the thermistor may be soldered to respective electrode pads, thereby not requiring a separate wire or space.

However, such a thermistor has some problems as follows.

First, a so-called Tombstone or Manhattan phenomenon occurs. When a thermistor is mounted on the PCB, the thermistor in which a solder is coated on the metal pattern and the electrode on the lower surface thereof is arranged on the electrode pad, and then the solder is reflowed by heating. Due to the applied heat, the PTC material and the electrode material of the thermistor are expanded. However, they have different thermal expansion coefficients, and in particular the thermistor having a configuration that the metal pattern and the electrode on the upper surface are connected through a side of the PTC material layer is structurally asymmetric, so right and left stresses are not uniform, thereby making the thermistor become inclined on the plane of PCB. As a result, physical and electrical reliability of the solder is significantly deteriorated. In order to lessen these problems, U.S. Pat. No. 6,380,839 suggested a thermistor structure in which thermal stress relief areas are formed in the electrodes on the upper and lower surfaces, but it does not give a fundamental solution.

In addition, the connection between the electrode on the upper surface and the metal pattern on the lower surface through a side of the PTC material layer drops physical and electric reliability. That is to say, the side of the PTC material layer is seriously influenced by an expansion pressure of PTC materials due to the heat applied during the solder reflow and due to the temperature increased while the thermistor is used, and if such a stress makes a crack in the connection portion formed on the side of the PTC material layer, this crack is propagated along the side of the PTC material layer, thereby probably cutting the electric connection.

In the prior art including the above U.S. patent, the thermistor is manufactured as follows. First, a plurality of long slits are formed in parallel on a sheet configured that metal films such as aluminum foils are coated on both sides of a PTC material layer, and then the electrodes or the metal patterns on the upper and lower surfaces are electrically connected through the slits. This slit becomes the aforementioned side of the PTC material layer later. A desired electrode pattern is formed between the slits, and then the processes such as solder resist coating and solder coating are conducted to successively make a plurality of thermistors between the slits. Finally, the sheet is cut in a direction perpendicular to the slits, thereby mass-producing thermistors of the same configuration.

However, if such long slits are formed in the sheet, a portion between the slits may droops down due to the gravity during the manufacturing process or be twisted due to the heat generated in the process. This results in that the pattern is inexactly formed in the electrode patterning process or the solder resist coating process, thereby increasing a failure rate.

SUMMARY OF THE INVENTION

The present invention is designed to solve the problems of the prior art, and therefore it is an object of the present invention to provide a thermistor having an excellent physical and electric reliability and ensuring smooth flow of current at a normal temperature.

Another object of the present invention is to provide a thermistor configured to be capable of giving a fundamental solution to the aforementioned Tombstone phenomenon and ensuring a connection portion of electrodes on upper and lower surfaces through a side of a thermistor material layer to endure a crack well.

Another object of the present invention is to provide a method for manufacturing a thermistor, which enables mass production of thermistors without causing twist or increasing a failure rate during its procedure.

In order to accomplish the above object, a thermistor according to the present invention is configured so that electrode patterns formed on each of upper and lower surfaces of a film resistance element are separated but engaged to each other with a non-conductive gap interposed therebetween, so the Tombstone phenomenon caused by a asymmetric structure is fundamentally eliminated.

That is to say, a thermistor according to an aspect of the invention includes a film resistance element changing a resistance depending on temperature; first and second electrodes formed on one surface of the film resistance element so as to be electrically separated from each other; third and fourth electrodes formed on the other surface of the film resistance element opposite to one surface so as to be electrically separated from each other; a first connection portion for electrically connecting the first electrode and the third electrode; and a second connection portion for electrically connecting the second electrode and the fourth electrode, wherein the first and second electrodes have shapes symmetrically engaged to each other with a non-conductive gap interposed therebetween, while the third and fourth electrodes have shapes symmetrically engaged to each other with a non-conductive gap interposed therebetween.

Preferably, the first and second electrodes have a pattern rotationally symmetric to a pattern of the third and fourth electrodes so that the pattern on the surface of the thermistor is coincided when the thermistor is turned over.

In addition, the non-conductive gaps between the first and second electrodes and between the third and fourth electrodes may have various shapes such as crank, rectangular wave, zigzag or wave.

Meanwhile, a thermistor according to another aspect of the invention is configured so that electrode patterns formed one of both surfaces of the film resistance element are symmetrically engaged as mentioned above, and a connection portion for connecting the electrode on both surfaces surrounds a part of, not all of, the side of the film resistance element so as to prevent a crack of the connection portion, if happens, from being propagated.

That is to say, the thermistor according to this aspect of the invention includes a film resistance element having grooves on one side and the other side opposite to one side, the film resistance element changing a resistance depending on temperature; first and second electrodes having shapes symmetrically engaged to each other on one surface of the film resistance element with a non-conductive gap interposed therebetween; third and fourth electrodes formed on the other surface of the film resistance element opposite to one surface so as to be electrically separated from each other; a first connection portion for electrically connecting the first electrode and the third electrode with surrounding one side except the groove formed in the film resistance element; and a second connection portion for electrically connecting the second electrode and the fourth electrode with surrounding the other side except the groove formed in the film resistance element.

On the other hand, in order to accomplish the above object, the present invention provides a method for manufacturing a thermistor, in which a plurality of elongated through holes are formed in a film resistance sheet in a matrix shape, and the thermistor is formed in each region between the through holes.

That is to say, the method for manufacturing a thermistor according to one aspect of the invention includes preparing a sheet configured that metal films are laminated on both surfaces of a film resistance element which changes a resistance depending on temperature; forming a plurality of through holes having a predetermined width and a length longer than the width in the sheet in a matrix pattern; electrically connecting the metal films laminated on both surfaces of the sheet through a side wall of the through hole; forming an electrode pattern by patterning the metal film; and cutting the sheet on which the electrode pattern is formed so that a region between adjacent through holes in a width direction of the through hole becomes one unit.

In addition, the object of the present invention may be obtained in a way of forming circular or oval through holes in a film resistance sheet, electrically connecting electrodes on both sides through the through hole, and then making the electrode patterns on both sides be rotationally symmetric.

That is to say, the method for manufacturing a thermistor according to another aspect of the invention includes preparing a sheet configured that metal films are laminated on both surfaces of a film resistance element which changes a resistance depending on temperature; forming a plurality of circular or oval through holes in the sheet in a matrix pattern; electrically connecting the metal films laminated on both surfaces of the sheet through a side wall of the through hole; forming an electrode pattern by patterning the metal films; and cutting the sheet in which the electrode pattern is formed so that a region between adjacent through holes in one direction along the arrangement of the through holes becomes one unit, wherein, in the electrode pattern forming step, for each metal film formed on both surfaces of the sheet, the metal film is partially removed in each region between adjacent through holes in one direction so as to make the electrode pattern into two parts which are separated but symmetrically engaged to each other and to make the electrode pattern coincided when the sheet is turned over.

BRIEF DESCRIPTION OF THE DRAWINGS

Other objects and aspects of the present invention will become apparent from the following description of embodiments with reference to the accompanying drawing in which:

FIG. 1b is a plane view showing an electrode pattern of the thermistor shown in FIG. 1a;

FIGS. 5a and 5b are sectional views taken along the 5—5 line of FIG. 4a;

DESCRIPTION OF THE PREFERRED EMBODIMENT

Hereinafter, preferred embodiments of the present invention will be described in detail referring to the accompanying drawings. Prior to the description, it should be understood that the terms used in the specification and appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Figure 1A:
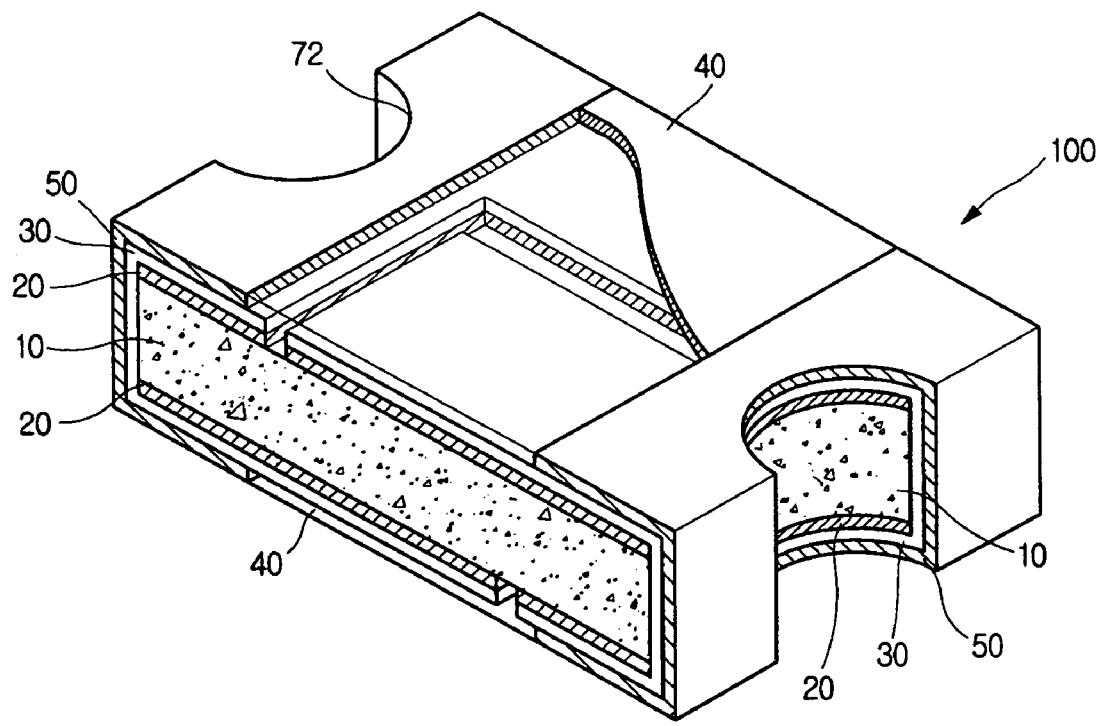
FIG. 1a is a perspective view showing a thermistor according to an embodiment of the present invention.
Figure 1B:
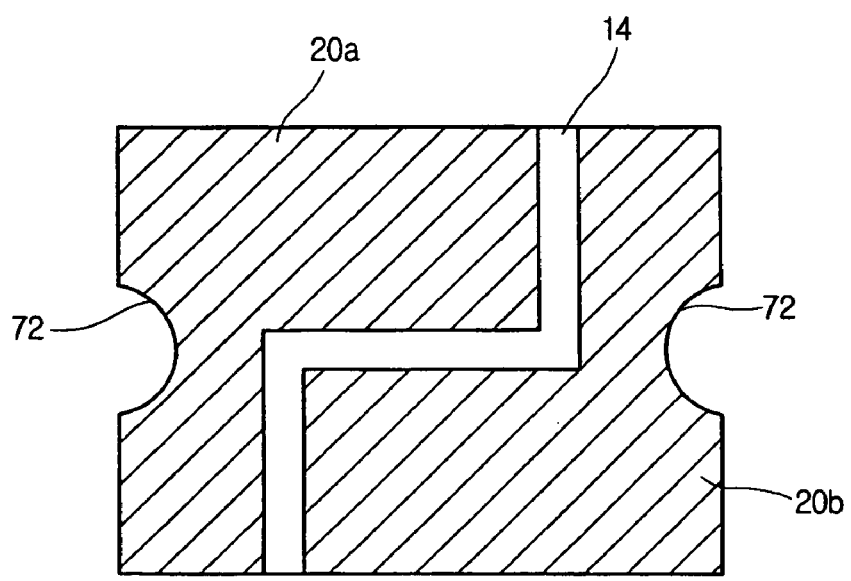

FIG. 1a is a perspective view showing a thermistor according to an embodiment of the present invention, and FIG. 1b is a plane view showing a pattern of an electrode 20 of the thermistor 100 shown in FIG. 1a.

Referring to FIGS. 1a and 1b, the thermistor of the present invention includes a film resistance element 10 changing its resistance depending on temperature, electrodes 20 respectively laminated on the upper and lower surfaces of the resistance element in a predetermined pattern, connection portions 30 for electrically connecting the electrodes on the upper and lower surfaces, solder resists 40 for covering the upper and lower surfaces of the thermistor, and solders 50 formed to surrounding both sides of the thermistor.

To describe the thermistor in more detail, the resistance element 10 is made of polymer in which conductive particles are dispersed to give PTC or NTC characteristics electrically. The polymer may adopt polyethylene, polypropylene and ethylene/propylene polymers, and the conductive particles may adopt carbon black or other metal particles.

The electrodes 20 formed on the upper and lower surfaces of the resistance element 10 are made of metal such as aluminum, copper or copper alloy, and the electrodes 20 are patterned in a predetermined pattern. The electrode pattern formed on the upper surface of the resistance element 10 is separated into two parts but engaged to each other with a non-conductive gap of a crank shape interposed therebetween, as shown in FIG. 1b. In addition, the electrode pattern formed on the lower surface of the resistance element 10 is also similarly separated into two parts but engaged to each other with a non-conductive gap of a crank shape interposed therebetween. That is to say, the electrode pattern of this embodiment is formed in a rotationally symmetric pattern which gives a coincident pattern when the thermistor 100 is turned over. Thus, the Tombstone phenomenon is fundamentally eliminated, and the thermistor of this embodiment may be more easily mounted on PCB since there is no need to distinguish upper and lower surfaces of the thermistor.

The connection portions 30 are made of metal such as copper or its alloy, and formed in the same way as the pattern of the electrodes 20. The connection portions 30 cover the electrodes 20 respectively and electrically connect the electrodes on the upper and lower surfaces with surrounding the sides of the thermistor 100.

The solder resists 40 are formed upon the electrode pattern at center portions of the upper and lower surfaces of the thermistor 100 together with the non-conductive gaps 14, respectively. Thus, in the solder forming process described later, the solder 50 is not formed at a region where the solder resist 40 is formed. Meanwhile, the perspective view of FIG. 1a shows the solder resist 40 is partially cut away so that the electrode 20 and the connection portion 30 formed below the solder resist 40 are partially revealed, for easy understanding.

The solder 50 commonly made of Sn/Pb plating is formed in contact with the connection portion 30 to surround the side of the thermistor 100. The solder 50 is soldered in contact with an electrode pad formed on PCB when the thermistor 100 is mounted on the PCB, thereby acting as a terminal for ensuring supply of electric current to the electrode 20 of the thermistor.

Meanwhile, on both sides of the thermistor, though not particularly limited to a specific shape, substantially semi-circular grooves 72 are formed. The resistance element 10, the electrode 20 and the connection portion 30 are exposed through the groove 72. That is to say, the connection portion 30 is formed not on the entire side of the thermistor 100 but a region of the side except the groove 72. Thus, though a crack is arisen in the connection portion 30 at the side of the thermistor 100 during a heat-applying process such as the solder reflow process or while the thermistor is in use, it is possible to prevent the crack from propagating through the entire side. In addition, the groove 72 may be useful for examining inferiority of the connection portion. That is to say, when the connection portion is examined through a vision instrument, an electrically-connected part having a big contrast to light and an electrically-unconnected part are positioned in one side, thereby facilitating the examination.

Figure 4A:
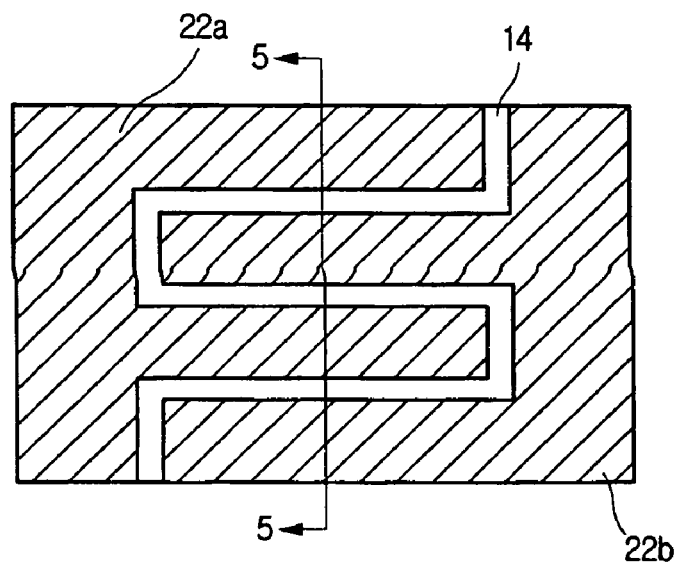
FIGS. 4a to 4c are plane views showing various examples of the electrode pattern applied to the embodiments of the present invention.
Figure 4B:
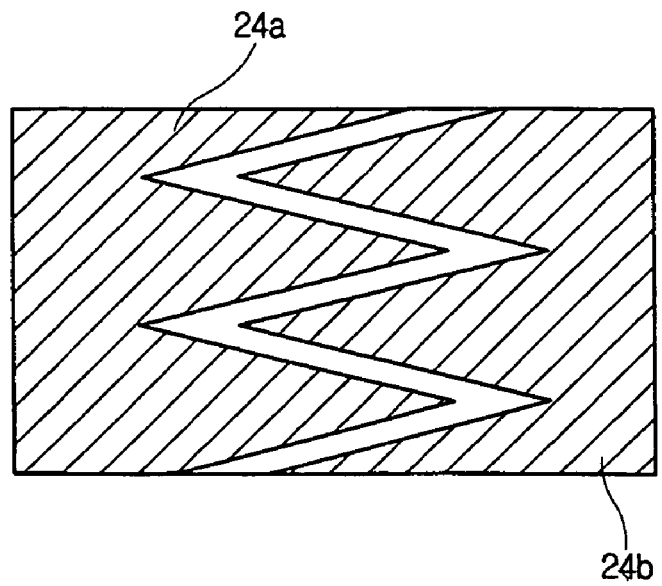
Figure 4C:
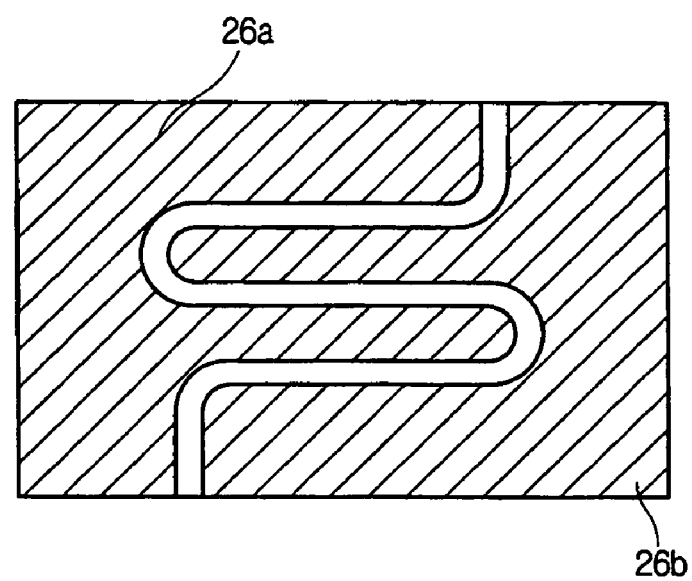

On the while, though the electrode pattern shown in FIG. 1b is shaped so that two parts are engaged to each other with the non-conductive gap 14 of a crank shape interposed therebetween, the electrode pattern of this embodiment is not limited to that case. For example, various shapes such as a rectangular wave shape, a zigzag shape (or, a chopping wave shape) and a waved shape may be used, as shown in FIGS. 4a to 4c.

Here, it is important that the non-conductive gap has a width smaller than a thickness of the resistance element with keeping a horizontal and rotational symmetric shape of the electrode pattern. By adopting such a horizontal and rotational symmetric shape of the electrode pattern, the Tombstone phenomenon is fundamentally eliminated, and the smaller width of the non-conductive gap ensures smooth current flow Ig (see FIGS. 5a and 5b) between adjacent electrode patterns on the upper or lower surface of the resistance element, thereby flowing sufficient current at a normal temperature. (that is, during normal operation of the thermistor).

In the end, in the fact that the electrode pattern is shaped so that a first electrode 22a and a second electrode 22b adjacent on the basis of the non-conductive gap 14 as a border are engaged to each other, the adjacent electrodes to which different voltages are applied configure a kind of resistor together with the resistance element. In addition, since the first and second electrodes are alternatively arranged on the basis of the border, when the electrodes are seen as a whole, the electrodes are configured like that a plurality of resistors having alternative polarities are arranged in parallel, thereby reducing overall resistance.

In addition, an amount of electric current flowing through the thermistor at a normal temperature is varied depending on a connection manner of the connection portion 30 which electrically connects the electrode 20 formed on the upper surface of the resistance element 10 and the electrode 20 formed on the lower surface. The connection portion 30 is formed on the side of the resistance element 10 as mentioned above, and some cases are taken into consideration in the following description: a case that the connection portion connects the electrodes formed on the upper and lower surfaces of the resistance element at both sides of the thermistor, seen from the figure, as for the electrode pattern shown in FIG. 4a; and a case that the connection portion connects the electrodes formed on the upper and lower surfaces of the resistance element at the upper and lower surfaces of the thermistor, seen from the figure.

Figure 5A:
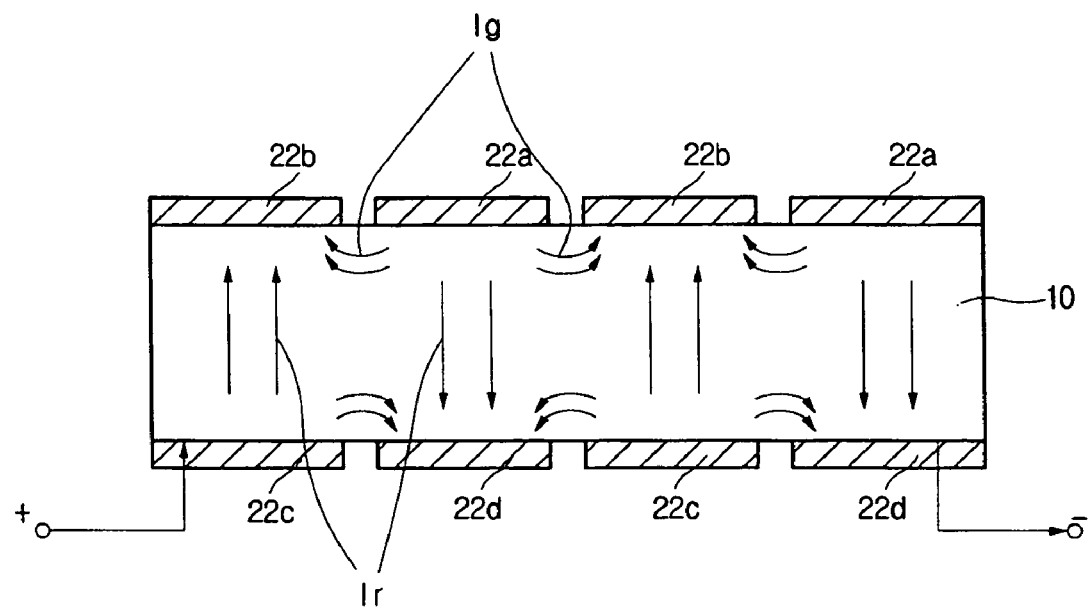
Figure 5B:
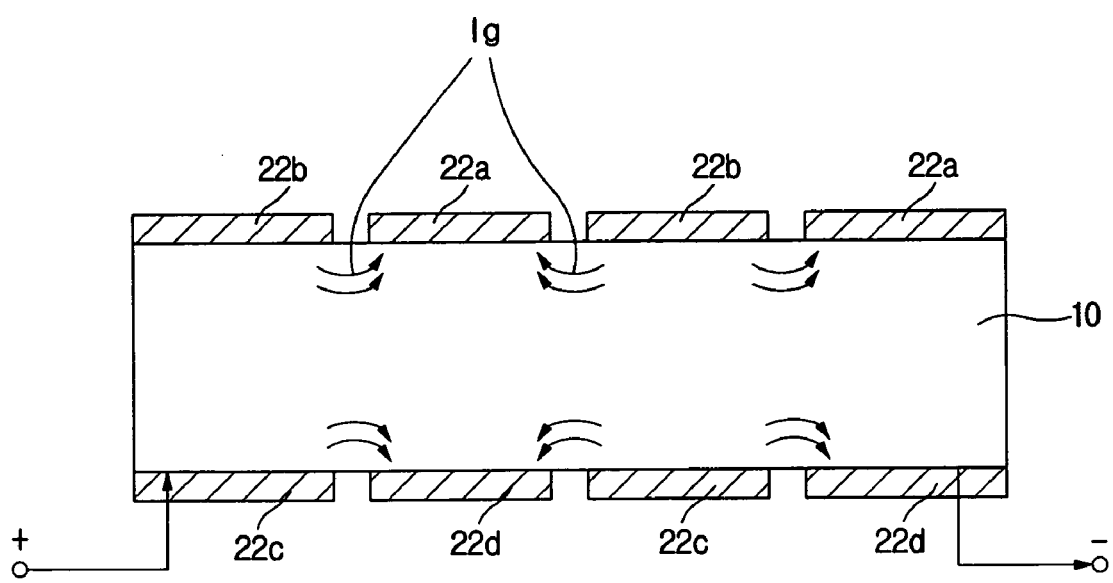

FIGS. 5a and 5b are sectional views schematically showing current flows in those cases. In FIG. 5a, the connection portion 30 connects the first electrode 22a formed on the upper surface of the resistance electrode 10 and the third electrode 22c formed on the lower surface as well as the second electrode 22b formed on the upper surface and the fourth electrode 22d formed on the lower surface, at both sides of the thermistor in FIG. 4a. In this case, if voltage is applied to the first and second electrodes 22a and 22b (strictly speaking, voltage is applied to the third and fourth electrodes 22c and 22d formed on the lower surface of the thermistor to be mounted on PCB), an electric current Ig is flowed through a surface layer of the resistance element between the adjacent electrodes (or, through the non-conductive gap) formed on the upper and lower surfaces of the resistance element 10, and at the same time an electric current Ir is also flowed between the opposite electrodes on the upper and lower surfaces with the resistance element 10 interposed therebetween in a thickness direction of the resistance element 10, as shown in FIG. 5a.

In FIG. 5b, the connection portion 30 connects the first electrode 22a formed on the upper surface of the resistance element 10 and the fourth electrode 22d formed on the lower surface as well as the second electrode 22b formed on the upper surface and the third electrode 22c formed on the lower surface. In this case, if voltage is applied to the first and second electrodes 22a and 22b (strictly speaking, voltage is applied to the third and fourth electrodes 22c and 22d formed on the lower surface of the thermistor to be mounted on PCB), an electric current Ig is flowed through a surface layer of the resistance element between the adjacent electrodes (or, through the non-conductive gap) formed on the upper and lower surfaces of the resistance element 10. However, the opposite electrodes with the resistance element 10 interposed therebetween are already electrically connected through the connection portion 30 to have the same polarity, so an electric current does not flow in a thickness direction of the resistance element 10. Thus, the connection structure of FIG. 5b has limited paths for electric current, compared with that of FIG. 5a.

Figure 2A:
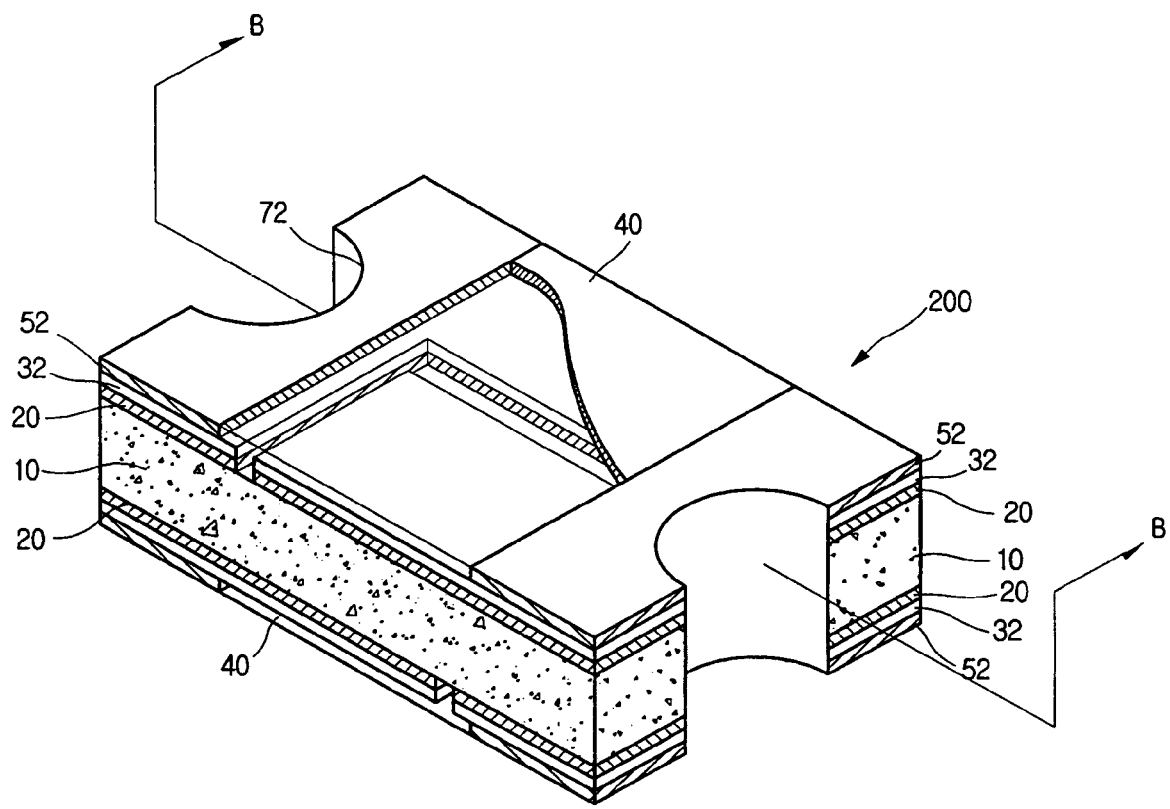
FIG. 2a is a perspective view showing a thermistor according to another embodiment of the present invention.
Figure 2B:
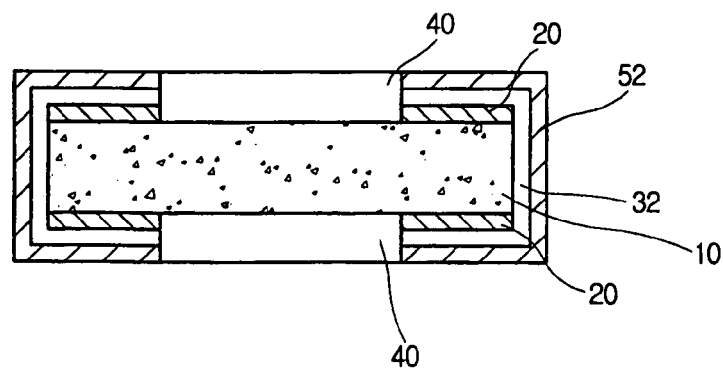
FIG. 2b is a sectional view of the thermistor shown in FIG. 2a, taken along the B—B line.

FIG. 2a is a perspective view showing a thermistor according to another embodiment of the present invention, and FIG. 2b is a sectional view of FIG. 2a, taken along the B—B line. Now, configuration of the thermistor 200 according to this embodiment will be described with reference to FIGS. 2a and 2b, focused on differences to the thermistor 100 of the former embodiment.

The thermistor 200 of this embodiment is different from the former embodiment in the point of configuration of its sides and a connection portion 32. That is to say, while the connection portion 30 of the former embodiment electrically connects the electrodes formed on the upper and lower surfaces through the sides of the thermistor 100 except the grooves 72 formed in the sides, the connection portion 32 of this embodiment electrically connects the electrodes 20 formed on the upper and lower surfaces through grooves 72 formed in the sides of the thermistor 200. In addition, a solder 52 is accordingly formed only on the groove 72. Other parts than the sides have the same configuration and are made of the same materials as the former embodiment.

According to this embodiment, like the former embodiment, configuration of the thermistor 200 is horizontally and rotationally symmetric, so the Tombstone phenomenon is fundamentally eliminated, and there is no need to distinguish upper and lower surfaces of a thermistor when the thermistor is mounted on PCB.

In addition, since the connection portion 32 is formed in the curved groove 72, a crack, if happens, is hardly propagated. Moreover, since electrically connected parts and electrically unconnected parts are shown from the same side, it is easy to examine inferiority of the connection portion.

Figure 3:
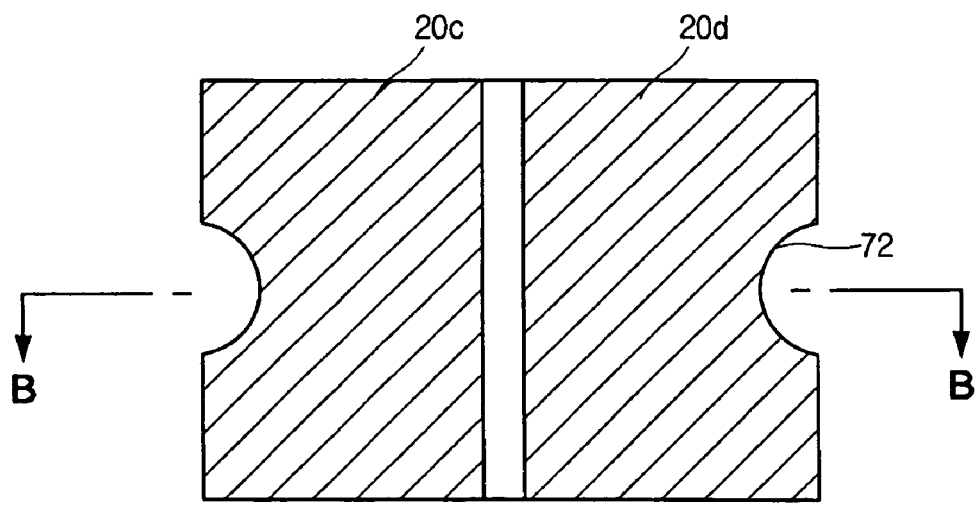
FIG. 3 is a plane view showing a thermistor according to still another embodiment of the present invention.

Meanwhile, the configuration of the thermistor according to the aforementioned embodiments may be variously modified. For example, though it is described that the same electrode pattern is formed on the upper and lower surfaces in the above embodiments so that the electrode pattern is coincided when the thermistor is turned over, the electrode patterns on the upper and lower surfaces may have different shapes. In addition, the electrode pattern on the lower surface which is to be mounted on PCB may have a simply-faced pattern as shown in FIG. 3 as an example, not the aforementioned pattern in which right and left patterns are engaged to each other, in order that the thermistor may be more stably contacted with a larger area of the electrode pad formed on PCB.

In addition, though it is described in the former embodiments that the semicircular groove 72 is formed in the side of the thermistor 100 and 200, the groove may be modified differently to have various shapes such as a semi-oval, "V"-type or rectangular shape. Moreover, though it is described in the former embodiments that the connection portion 30 and 32 electrically connects the electrodes on the upper and lower surfaces with surrounding the side except the groove 72 or the inner wall of the groove 72, it is also possible to electrically connect the electrodes on the upper and lower surfaces through the entire planar side of the thermistor without forming the groove itself.

Furthermore, though it is described in the former embodiments that the connection portion 30 and 32 is formed to surround the side of the thermistor, other modifications may be possible. For example, it is possible to form a through hole which is vertically penetrating the resistance element 10 in the thermistor, and then form a connection portion through the through hole. In addition, it is also possible that, in the step of preparing a sheet on which the resistance element 10 and the metal films 20 (or, the electrodes) are laminated in the thermistor manufacturing procedure described later in connection with FIG. 6a, metal wires (not shown) contacted with the metal films 20 formed on the upper and lower surfaces of the resistance element are positioned between adjacent resistance elements, which is a polymer sheet, to form a connection portion. In a word, configuration and shape of the connection portion are not specially limited if the electrode patterns formed on the upper and lower surfaces of the thermistor are horizontally and rotationally symmetric to eliminate the Tombstone phenomenon.

Now, a method for mass production of the thermistor 100 and 200 described above according to the present invention will be described in detail.

FIGS. 6a to 6g are diagrams for illustrating the method for manufacturing the thermistor 100 (see FIG. 1a) according to the first embodiment of the present invention, in each of which a plane view is located in a left region and a partial sectional perspective view taken along the C—C line is located in a right circle.

Figure 6A:
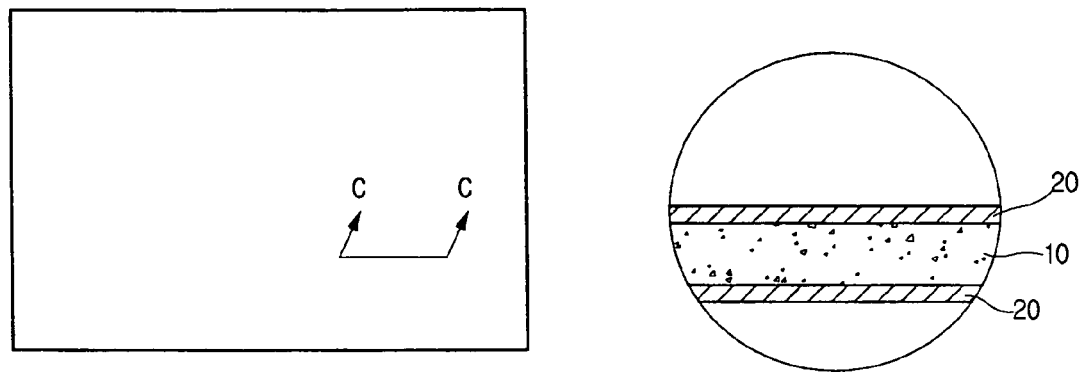
FIGS. 6a to 6g respectively depict plane view and partial sectional view together for illustrating a method for manufacturing a thermistor according to an embodiment of the present invention.

FIG. 6a shows a sheet of a film resistance element cut into a suitable size. The sheet is configured so that metal films 20, which will be electrodes of the thermistor later, are laminated on both surfaces of an NTC or PTC resistance element 10 whose resistance value changes depending on temperature. This sheet may be made by electrolytic- or electroless-plating of a metal such as aluminum or copper onto upper and low surfaces of a polymer sheet in which conductive particles are dispersed, or by compressing metal foils on both surfaces of the polymer sheet. The sheet made in such a way is then cut into a suitable size and washed for easy handling in a following process.

Figure 6B:
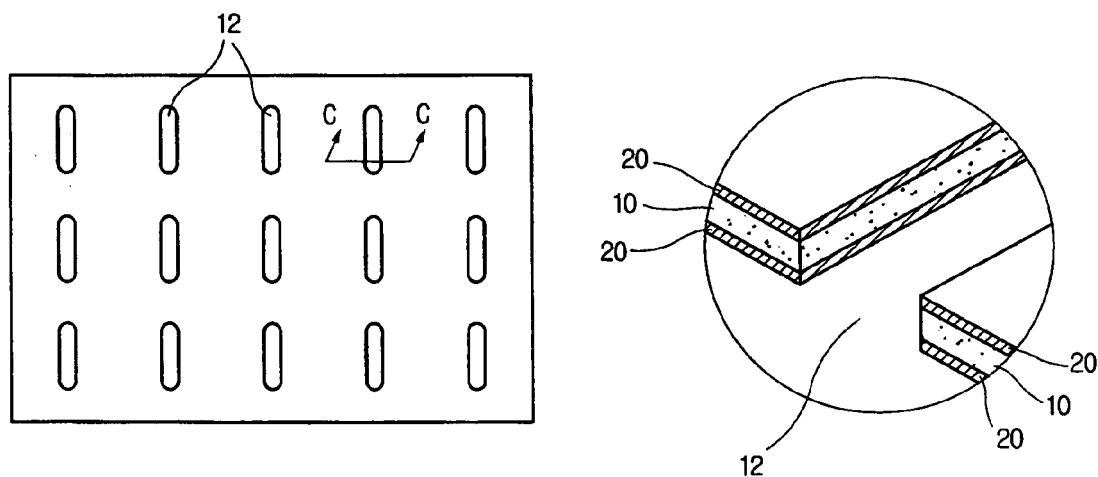

Subsequently, as shown in FIG. 6b, a plurality of through holes 12 having predetermined width and length are perforated. The plurality of through holes 12 are arranged in longitudinal and lateral directions, that is, in a matrix pattern. A thermistor is formed in each region between adjacent through holes in a width direction of the through hole 12 (or, a longitudinal direction in the figure). Meanwhile, the through holes 12 are formed at regular intervals in a longitudinal direction, differently from the long slits successively formed in one direction in the conventional sheet. Thus, the sheet is not drooped down or twisted along a longitudinal direction of the through holes in the succeeding processes.

Figure 6C:
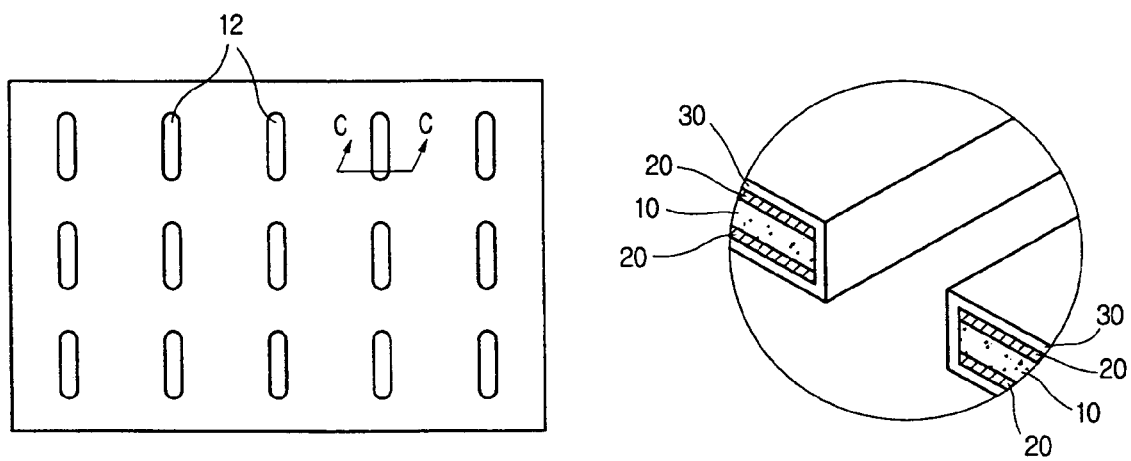

Then, as shown in FIG. 6c, copper or its alloy is plated on the entire surface of the sheet in which the through holes 12 are formed to electrically connect the metal films 20 on the upper and lower surfaces through the through holes 12. The plating film 30 of copper or its alloy formed in such a way becomes the aforementioned connection portion.

Figure 6D:
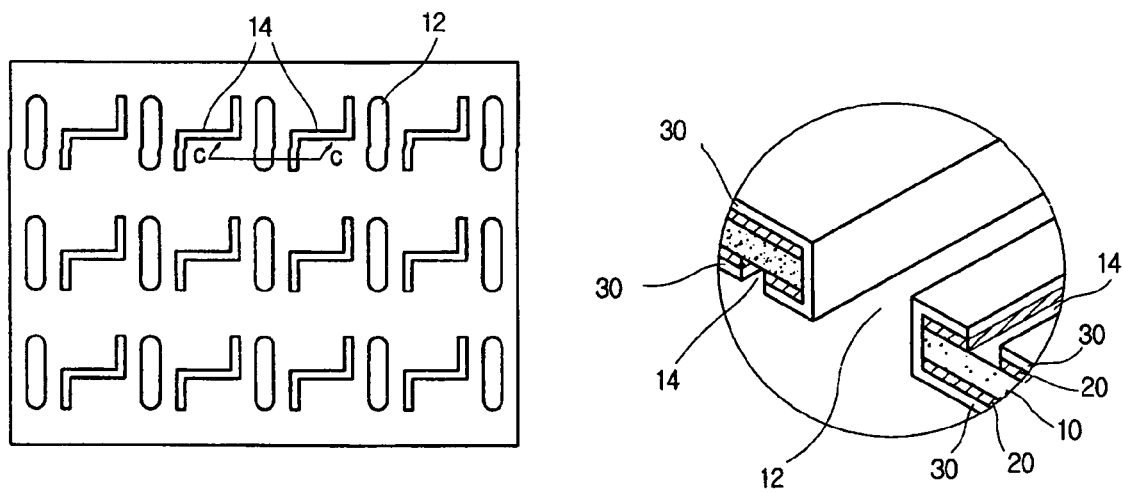

Then, as shown in FIG. 6d, the metal film 20 and the plating film 30 formed in each region between the through holes 12 are patterned to form a predetermined electrode pattern and a predetermined connection portion pattern. Specifically, a photo resist is coated on the sheet of FIG. 6c, and then exposed to light and developed into a desired pattern, and then the plating film 30 and the metal film 20 are subsequently etched with the formed photo resist pattern as an etching mask so that the resistance element 10 is exposed in a crank shape as shown in FIG. 6d. After that, the photo resist pattern is removed to form a sheet as shown in FIG. 6d.

In this procedure, an exposed region of the resistance element 10 becomes the aforementioned non-conductive gap 14. At this time, though it is depicted and described that the non-conductive gap 14 has a crank shape, the shape of the non-conductive gap 14 may be changed into various shapes such as a rectangular wave shape, a zigzag shape and a waved shape as shown in FIGS. 4a to 4c. In addition, the non-conductive gaps 14 formed on the upper and lower surfaces of the sheet may have the same shape or different shapes.

Figure 6E:
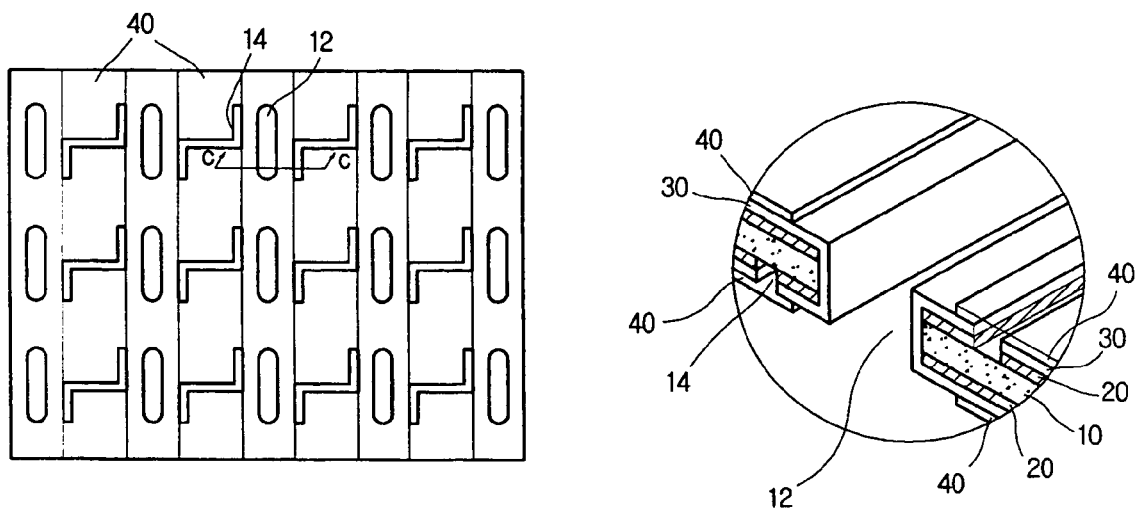

Subsequently, as shown in FIG. 6e, a solder resist 40 is formed on a region, requiring insulation, on the upper and lower surfaces of the sheet together with the non-conductive gap 14. After all, the solder resist 40 is formed on a region except an area on and near the through hole 12. The solder resist may be formed in various ways such as screen printing, liquid photolithography, laminating of a dry film or the like.

Figure 6F:
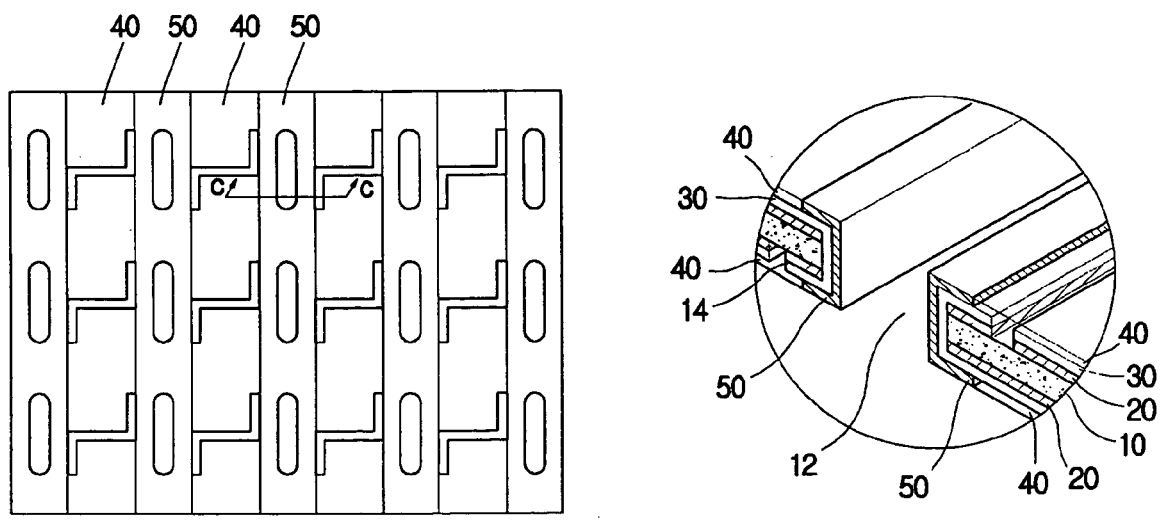

Then, Sn/Pb plating is conducted on the sheet on which the solder resist 40 is already formed, thereby forming the solder 50 on the inner circumference of and near the through hole 12 except the region where the solder resist 40 is already formed as shown in FIG. 6f. This solder is to be acted as a terminal connected to the electrode pad on PCB by means of the solder reflow method when the thermistor is mounted on PCB later.

Figure 6G:
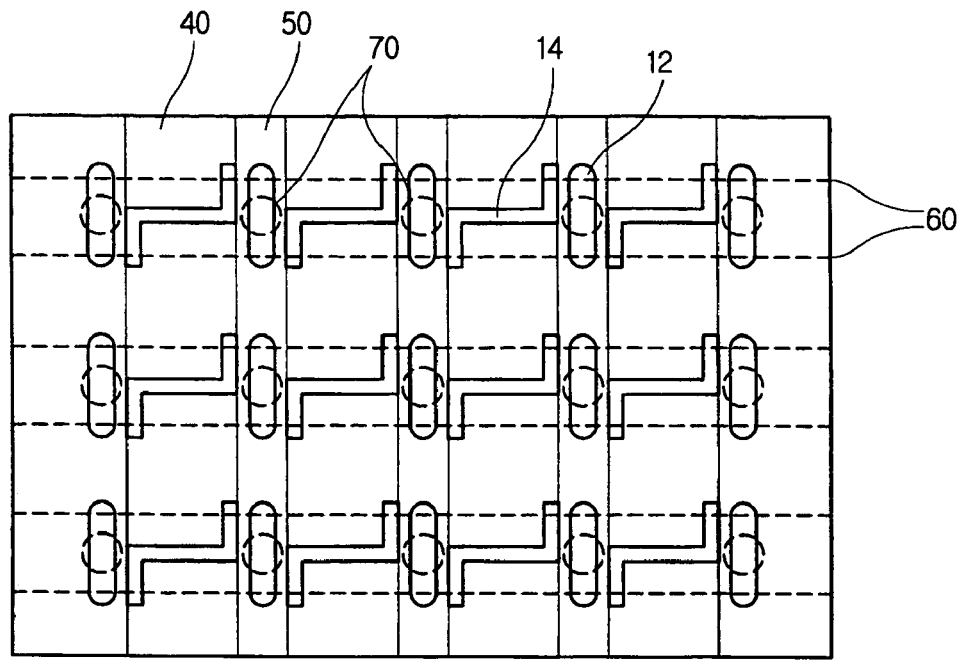

Finally, as shown in FIG. 6g, the sheet is cut along a cutting line 60, thereby making each region between adjacent through holes in a width direction of the through hole 12 into a unit thermistor. At this time, a middle portion of the side wall of the through hole 12 is cut in a circular or oval shape 70, thereby completing the thermistor having the groove 72 in its sides as shown in FIG. 1a. Cutting the sheet may be realized by means of a sawing process or a sheet metal working using a mould. Meanwhile, if the circular or oval shape perforating process is excluded in FIG. 6g, it is also possible to manufacture a thermistor configured that the electrodes on the upper and lower surfaces are connected through the entire sides of the thermistor.

Figure 7:
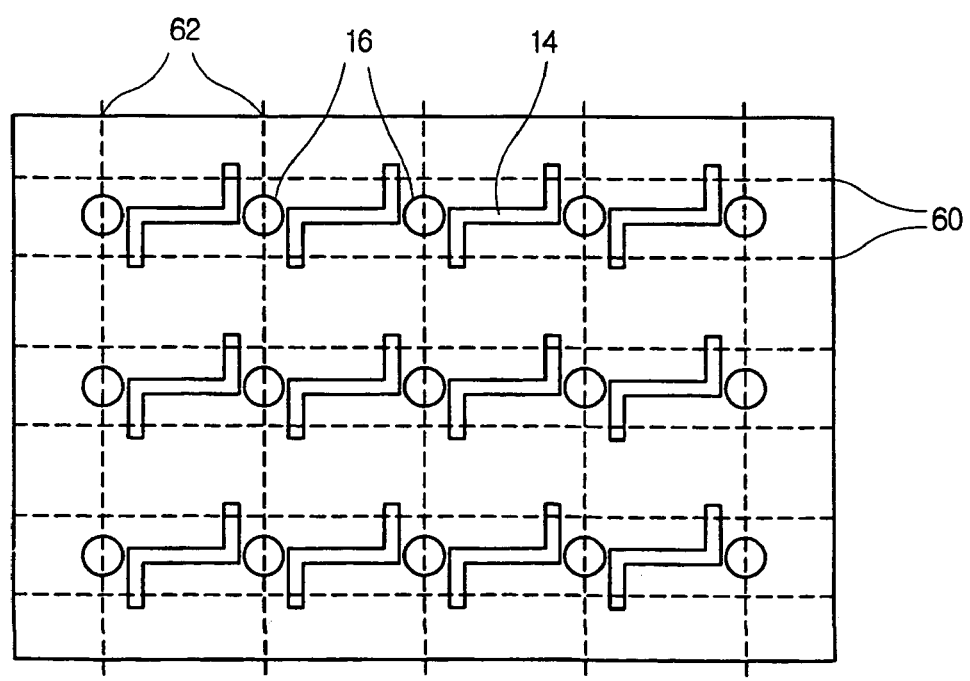
FIG. 7 is a plane view for illustrating a method for manufacturing a thermistor according to another embodiment of the present invention.

FIG. 7 is for illustrating a method for manufacturing the thermistor 200 (see FIG. 2a) according to the second embodiment of the present invention. The following description is focused on different factors to the thermistor manufacturing method of the first embodiment.

As mentioned above, the thermistor 200 of FIG. 2a has a side configuration that the electrodes on the upper and lower surfaces are connected through the semicircle or semi-oval groove 72, differently from the thermistor 100 of FIG. 1a. In order to manufacture such a thermistor 20, circular or oval through holes 16 are formed in the sheet as shown in FIG. 6a, instead of the elongated through hole 12 of FIG. 6b, and then, after conducting the connection portion forming process, the electrode patterning process and the solder resist and solder forming process, the sheet is cut along the cutting lines 60 and 62 shown in FIG. 7.

Meanwhile, in the example of FIGS. 6g and 7, since the same non-conductive gaps 14 of a crank shape are formed in each area between the through holes 12 and 16, the sheet is wasted as much as certain margins in upper and lower portions than the through hole, when seen from the figure. It is because the through holes are arranged at regular intervals, without forming long slits successive in a vertical direction, so that the sheet is not twisted during the thermistor manufacturing procedure.

Figure 8:
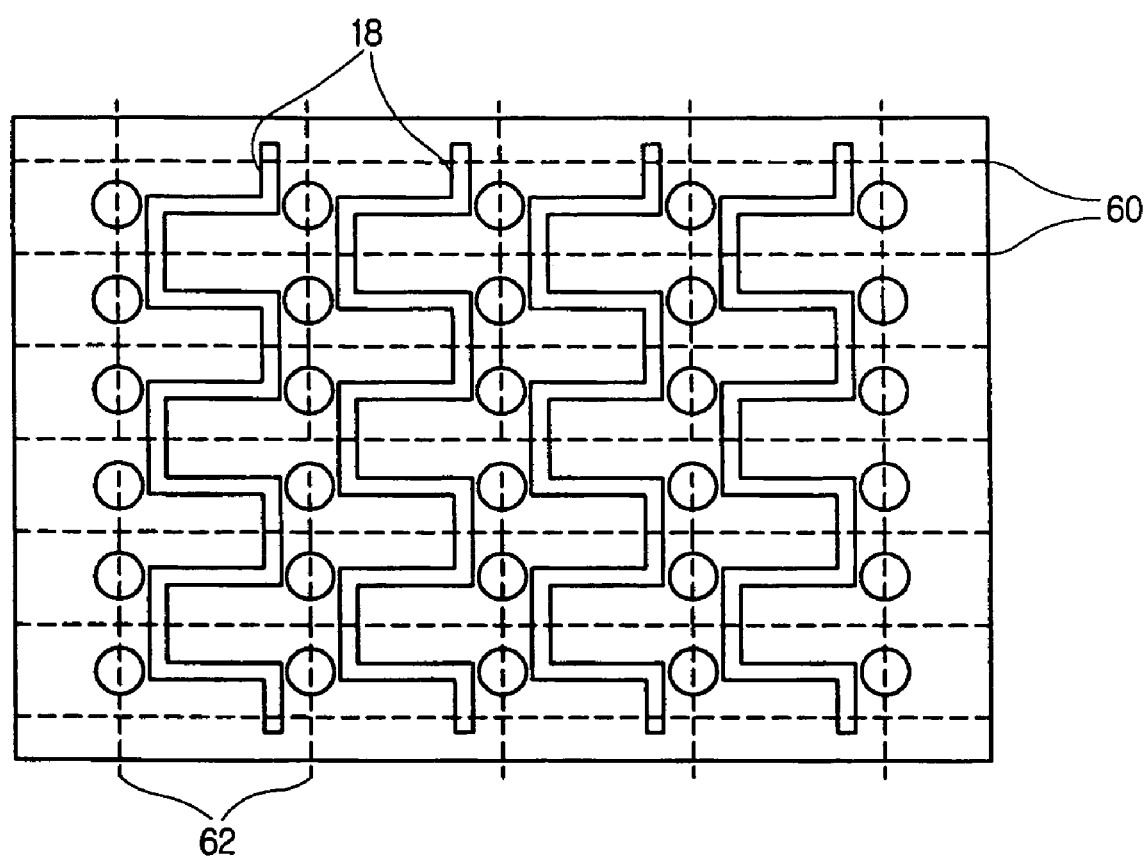
FIG. 8 is a plane view for illustrating a method for manufacturing a thermistor according to still another embodiment of the present invention.

As for the fact, the thermistor 200 of this embodiment may be configured so that through holes 16 are originally not successive, differently from the through holes 12 of FIG. 6g which are resulted from discontinuous forming of long slits which are originally successive. Thus, like FIG. 8, instead of forming the non-conductive gaps 18 on a region where each thermistor is formed to have the same shape, it is possible to successively form gaps 18 by turning over the crank shape in a right or left direction with alternating in a vertical direction on the drawing, and then cut the sheet along the cutting lines 60 and 62, thereby manufacturing the thermistor 200. As a result, there is no margin between the cutting lines 60 which is to be wasted, thereby eliminating waste.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

APPLICABILITY TO THE INDUSTRY

The thermistor of the present invention structurally has a symmetric shape, so it is possible to fundamentally prevent the Tombstone phenomenon caused by asymmetric structure. In addition, since the electrodes on the same surface of the thermistor to which different voltages are applied are arranged to be engaged to each other with the non-conductive gap interposed therebetween, a current flow is increased, thereby improving a resistance characteristic of the thermistor at a normal temperature.

Moreover, since the groove is formed in the side of the thermistor and the electrodes on the upper and lower surfaces are electrically connected through the groove or through the side except the groove, the thermistor of the present invention prevents a crack, if generated in the connection portion, from being propagated along the side of the thermistor, thereby capable of providing a thermistor with high reliability.

Furthermore, according to the method for manufacturing a thermistor, since the elongated through holes are arranged in the sheet in a matrix pattern longitudinally and laterally at regular intervals, it is possible to prevent the sheet from being twisted during the thermistor manufacturing procedure.

What is claimed is:

1. A thermistor comprising:
a film resistance element changing a resistance depending on temperature;
first and second electrodes formed on one surface of the film resistance element so as to be electrically separated from each other;
third and fourth electrodes formed on the other surface of the film resistance element opposite to one surface so as to be electrically separated from each other;
a first connection portion for electrically connecting the first electrode and the third electrode; and
a second connection portion for electrically connecting the second electrode and the fourth electrode,
wherein the first and second electrodes have shapes symmetrically engaged to each other with a non-conductive gap interposed therebetween, while the third and fourth electrodes have shapes symmetrically engaged to each other with a non-conductive gap interposed therebetween,
wherein the non-conductive gap has a width smaller than a thickness of the film resistance element.

2. A thermistor according to claim 1,
wherein the first and second electrodes have a pattern rotationally symmetric to a pattern of the third and fourth electrodes so that the pattern on the surface of the thermistor is coincided when the thermistor is turned over.

3. A thermistor according to claim 1,
wherein the first and second connection portions electrically connect the first and third electrodes and the second and fourth electrodes with respectively surrounding one side of the film resistance element and the other side opposite to one side.

4. A thermistor according to claim 3,
wherein grooves are respectively formed on one side and the other side of the film resistance element, and the first and second connection portions electrically connect the first and third electrodes and the second and fourth electrodes with respectively surrounding one side and the other side except the grooves.

5. A thermistor according to claim 3,
wherein grooves are respectively formed on one side and the other side of the film resistance element, and the first and second connection portions electrically connect the first and third electrodes and the second and fourth electrodes with respectively surrounding the grooves of one side and the other side.

6. A thermistor according to claim 1,
wherein the non-conductive gaps between the first and second electrodes and between the third and fourth electrodes have a shape of crank, rectangular wave, zigzag or wave.

7. A thermistor according to claim 1,
wherein voltages of different polarities are applied to the first and second electrodes or to the third and fourth electrodes so that voltages of different polarities are applied to adjacent electrodes on one surface of the film resistance element and to electrodes opposite to each other with the film resistance element interposed therebetween.

8. A thermistor according to claim 1,
wherein the film resistance element is made of a polymer having a positive temperature coefficient.

9. A thermistor according to claim 1,
wherein the first to fourth electrodes are made of copper or its alloy.

10. A thermistor comprising:
a film resistance element having grooves on one side and the other side opposite to one side, the film resistance element changing a resistance depending on temperature;
first and second electrodes having shapes symmetrically engaged to each other on one surface of the film resistance element with a non-conductive gap interposed therebetween;
third and fourth electrodes formed on the other surface of the film resistance element opposite to one surface so as to be electrically separated from each other;
a first connection portion for electrically connecting the first electrode and the third electrode with surrounding one side except the groove formed in the film resistance element; and
a second connection portion for electrically connecting the second electrode and the fourth electrode with surrounding the other side except the groove formed in the film resistance element,
wherein the non-conductive gap has a width smaller than a thickness of the film resistance element.

11. A thermistor according to claim 10,
wherein the non-conductive gaps between the first and second electrodes have a shape of crank, rectangular wave, zigzag or wave.

12. A thermistor according to claim 10,
wherein voltages of different polarities are applied to the first and second electrodes or to the third and fourth electrodes so that voltages of different polarities are applied to adjacent electrodes on one surface of the film resistance element and to electrodes opposite to each other with the film resistance element interposed therebetween.

13. A thermistor according to claim 10,
wherein the film resistance element is made of a polymer having a positive temperature coefficient.

14. A thermistor according to claim 10,
wherein the first to fourth electrodes are made of copper or its alloy.

* * * * *